United States Patent [19]

Keiser et al.

[11] Patent Number: 4,671,970
[45] Date of Patent: Jun. 9, 1987

[54] TRENCH FILLING AND PLANARIZATION PROCESS

[75] Inventors: Alan E. Keiser; Randall S. Mundt, both of Colorado Springs, Colo.

[73] Assignee: NCR Corporation, Dayton, Ohio

[21] Appl. No.: 826,402

[22] Filed: Feb. 5, 1986

[51] Int. Cl.$^4$ ............................................. H01L 21/76
[52] U.S. Cl. ...................................... 427/93; 156/643; 29/576 W; 427/94; 427/95; 430/314
[58] Field of Search ................ 29/576 W; 427/93, 94, 427/86, 95; 430/314; 156/643

[56] References Cited

U.S. PATENT DOCUMENTS

| | | | |
|---|---|---|---|
| 4,445,967 | 5/1984 | Kameyama | 29/576 W |
| 4,473,598 | 9/1984 | Ephrath | 29/576 W |
| 4,493,740 | 1/1985 | Komeda | |
| 4,506,434 | 3/1985 | Ogawa et al. | |
| 4,509,249 | 4/1985 | Goto | 29/576 W |
| 4,551,911 | 11/1985 | Sasaki | 29/576 W |
| 4,571,819 | 2/1986 | Rogers | 427/93 |

Primary Examiner—John D. Smith
Attorney, Agent, or Firm—Wilbert Hawk, Jr.; Casimer K. Salys

[57] ABSTRACT

A process for forming planar trench oxide isolated integrated circuit devices. In particular, the process fills trenches of diverse widths, yet provides a final structure in which the narrow trench dielectrics, the wide trench dielectrics, and the active region surfaces are substantially coplanar. Furthermore, the process reduces the likelihood of creating voids in the narrow trenches. According to one practice, following the formation of the trenches in the substrate, successive layers of conformal silicon nitride, conformal polysilicon, and relatively conformal CVD oxide are formed to the relative depth of the trenches. A photoresist mask is then first selectively formed over the central regions of the wide trenches and then used as a mask during the anisotropic etch of exposed oxide. The underlying polysilicon layer serves as an oxide etchant stop, and also provides the material from which the next successive oxidation partially fills the previously etched regions with thermal silicon dioxide. A further planarizing layer of oxide is then formed by poly deposition and oxidation. The nitride layer underlying the polysilicon layer prevents oxidation of the substrate. Fabrication is concluded with a planarization to the level of the active regions, including an etch of the nitride layer over such active regions.

11 Claims, 5 Drawing Figures

TRENCH FILLING AND PLANARIZATION PROCESS

CROSS-REFERENCE TO RELATED APPLICATIONS

This invention is related to U.S. Pat. No. 4,571,819 and co-pending U.S. patent application Ser. No. 783,717, a division of the application issuing as U.S. Pat. No. 4,571,819, by inventors Rogers et al., assigned to the assignee of the present invention.

BRIEF SUMMARY

The present invention relates to a process for fabricating integrated circuit electronic devices. More particularly, the invention is directed to the formation of planarized, dielectrically filled trenches between active regions in a semiconductor substrate. As a particular feature, the invention provides the capability to fill and planarize trenches differing in width dimensions at different locations in a common substrate.

According to one practice of the invention, the active regions and trench regions in a semiconductor substrate are first defined by relatively conventional photolithographic masking, and thereafter the trenches are formed by anisotropic etching into the substrate. Upon the conclusion of the etching operation, the active regions of the substrate are isolated by trenches which vary significantly in width at different locations across the surface of the substrate. According to the particulars of the present invention, the silicon substrate is then oxidized to form a thin PAD silicon dioxide (oxide) layer, which layer is in succession covered by a conformally deposited silicon nitride (nitride) layer, a conformally deposited polycrystalline silicon (polysilicon) layer, and a relatively conformally deposited trench oxide layer. The trench oxide layer is deposited until the level in the central regions of the wide trenches is substantially coplanar with the surface of the substrate active regions.

Fabrication according to the present process continues with the formation of a photolithographically defined photoresist material masking layer, pattern to overlay the trench oxide in the level central regions of the wide trenches while exposing the trench oxide layer in the narrow trench regions, over the active regions, and along the peripheries of the wide trench regions. An anisotropic etch of the trench oxide layer follows, using an etchant for which polysilicon acts as an etch stop. In the presence of the photoresist mask, the anisotropic oxide etch operation removes the trench oxide layer only from the active regions, the wide trench region peripheries, and the narrow trenches. The oxide layer under the masking photoresist remains intact and aligned with the level, central regions of the wide trenches.

Following a strip of the photoresist, the substrate is oxidized in an ambient suitable to convert the polysilicon layer to silicon dioxide and thereby partially fill the narrow trenches and wide trench peripheries. The silicon substrate itself is not oxidized during the polysilicon conversion by virtue of the thin nitride layer, the nitride being an oxidation barrier. Recesses remaining after the growth of the oxide from the polysilicon are filled by a subsequent deposition of polysilicon, an oxidation of such polysilicon, and a planarization of the resultant oxide to the level of the nitride over the active region surface. An etch of the nitride layer and thin PAD oxide layer covering the active region surfaces then exposes the silicon substrate in the active region while retaining the substantially planar character of the wafer surface across both active regions and trenches of varying widths.

These and other aspects of the invention will be more clearly understood and appreciated upon considering the detailed description which follows.

DETAILED DESCRIPTION

Figure 1:
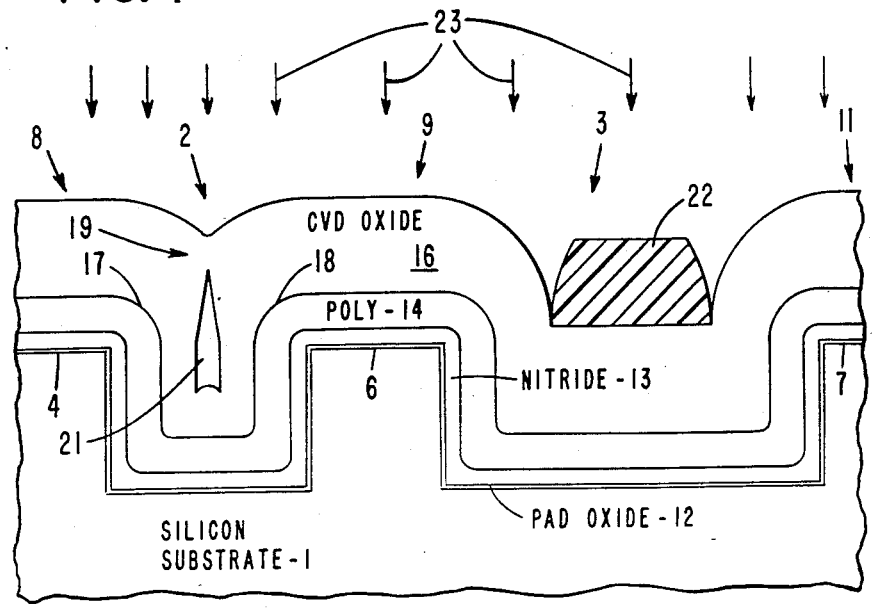
FIG. 1 is a schematic cross-section of a substrate with active and trench regions covered by the various deposited and patterned layers.

The technology by which integrated circuit semiconductor devices are fabricated has continued to evolve and to pursue as a primary objective the further miniaturization of the structural features characterizing the various devices. In addition to dimensional reductions of the active devices, active regions, contacts and electrically isolating dielectric regions, there also continues to be an increasing need for more interconnect layers which are themselves comprised of conductors having smaller dimensions. As a consequence, the "bird's beak" type oxide encroachment and nonplanar surfaces created by the commonly used local oxidation of silicon technique has led to the pursuit of planarized dielectrically filled trench structures for active region isolation. In a similar vein, it is also known that photolithographically defined photoresist patterns can be more precisely patterned when done on a relatively plana substrate surface.

The creation of trenches having vertical walls and being uniformly filled with dielectric materials such as silicon dioxide, while providing trench surfaces which are substantially coplanar with the active regions, has proven to be more elusive than most practitioners originally contemplated. In particular, significant efforts have been expended to develop broadly applicable techniques for filling with dielectric trenches of varying width dimensions. Unfortunately, the techniques which grow silicon dioxide dielectric from the silicon of the substrate typically introduce stress problems in the final structure because of the volumetric increases associated with the conversion of the monocrystalline silicon to silicon dioxide, while the techniques which rely upon the use of deposited silicon dioxide to fill the trenches either form voids in narrow trenches, insufficiently fill with dielectric the wide trench regions, or produce a composite surfaced topography so uneven that planarizing techniques, including the use of viscous polymers, are incapable of producing a substantially planar substrate surface upon the conclusion of trench formation.

One approach suggested for overcoming the various problems is set forth in U.S. Pat. No. 4,445,967. According to the teaching therein, as illustrated in FIGS. 1A—1F thereof, following the formation of the major trenches in the substrate, a dielectric layer is blanket deposited and then selectively masked by photoresist in the wide trench regions. An anisotropic etch of the exposed dielectric, and thereafter the subsequently exposed substrate, is followed, in order, by a second dielectric deposition and a planarization etch. With the focus of attention being directed to the filling of wide trench regions, no attempt is made to limit the formation of voids in the narrow trenches. If anything, the selective deepening of the trench regions adjacent the active devices would accentuate the likelihood of forming voids. The problems created by contaminents trapped in voids are notorious. A similar approach is pursued in U.S. Pat. No. 4,551,911.

To create dielectrically filled trenches of varying widths, without voids, and with a substantially planar concluding surface topography, the present invention contemplates, following the etching of the trenches, the fabrication steps of: growing a thin stress-relief oxide layer; depositing a thin and conformal silicon nitride oxidation barrier layer; depositing of a conformal polysilicon layer; forming a chemical vapor deposition (CVD) of silicon dioxide; masking the planar central regions of the wide trenches with photoresist; anisotropically etching substantially all exposed oxide to the level of the deposited polysilicon; oxidizing the deposited polysilicon to partially fill the commonly narrow trenches created by the oxide etch step; depositing and oxidizing a second polysilicon layer to substantially fill the commonly narrow trenches; and planarizing to the level of the active regions, including the removal of the thin nitride and oxide layers over the active regions of the substrate. Consider now a specific embodiment, as described in the ensuing text and illustrated in the accompanying figures.

The cross-section schematically depicted in FIG. 1 illustrates the structure created upon the conclusion of the first group of steps according to a preferred practice of the invention. In preparation for such processing, monocrystalline silicon substrate 1 is first anisotropically etched in any one of numerous known manners to create narrow trench regions 2 and wide trench regions 3, the trenches serving to separate active regions 8, 9 and 11 having respective active surfaces 4, 6 and 7. For purposes of this embodiment, narrow trenches are defined to be those which are less than or equal to 4 micrometers in width; all trenches wider than 4 micrometers are correspondingly defined as being wide. Substrate 1 is then subjected to a relatively brief thermal oxidation operation to form a PAD oxide layer 12. PAD oxide layer 12 provides a stress relief interface between monocrystalline substrate 1 and the subsequently deposited silicon nitride layer 13. Preferably, the thermal oxidation is performed in a $H_2O$ and $O_2$ gas ambient at a temperature at approximately 1050°, at atmospheric pressure, and for a period of approximately 45 minutes, to create a substantially conformal thermal PAD oxide layer approximately 100 nanometers thick.

Following the growth of PAD oxide 12, the wafer is conformally covered with a layer of silicon nitride 13, preferably deposited using a plasma enhanced CVD operation with a mixture of $SiH_2Cl_2$ and $NH_3$, while in a chamber having an ambient temperature of approximately 860°, at a pressure of approximately 0.25 torr for period of approximately 55 minutes, to form a layer approximately 100 nanometers thick. As will be more fully understood from the ensuing development, nitride layer 13 will serve as an oxidation barrier to mask the active regions and trenches during the conversion of subsequently formed polycrystalline or amorphous silicon layers to trench oxides.

Again referring to FIG. 1, the substrate is next blanket covered by a conformal deposition of polycrystalline silicon layer 14. Preferably polysilicon (poly) layer 14 is formed in a CVD operation using $SiH_4$, at a temperature of approximately 620° C., at a pressure of approximately 0.26 torr and for a period of approximately 35 minutes, to form a layer 14 approximately 250 nanometers thick. Though it is preferred that poly layer 14 be intrinsic polycrystalline silicon, it is also feasible to deposit lightly doped polycrystalline silicon or amorphous silicon. As will be more fully appreciated later, poly layer 14 between nitride layer 13 and oxide layer 16, the formation of which is set forth hereinafter, serves two purposes. First, poly layer 14 serves as an etch stop for the plasma etch of oxide layer 16. In its second capacity, poly layer 14 provides the silicon which upon later conversion to silicon dioxide inhibits the formation of voids in the narrow trenches.

The last layer formed on substrate 1 to create the cross-sectional structure depicted in FIG. 1 is plasma enhanced CVD silicon dioxide layer 16. Preferably, this is practiced by subjecting substrate 1 to reactants of $SiH_4$ and $O_2$ at a pressure of approximately 0.25 Torr, at a temperature of approximately 425° C., and for a period of approximately 85 minutes, to form a layer approximately 2,000 nanometers thick on the wide horizontal surfaces, such as the center region of wide trench 3. As is known by those who routinely practicing in the art, though plasma enhanced CVD oxide is relatively conformal in its deposition it does exhibit some re-entry or cusping characteristics at relatively sharp corners, such as 17 and 18 in FIG. 1. Therefore, it is not unusual to have a premature closure of the oxide being deposited into a narrow trench. For example, see the closure at 19 in FIG. 1 and void 21 formed thereby. Note that the level of CVD oxide 16 in the central region of wide trench 3 approximates the thickness over active region surfaces 4, 6 and 7. To improve the likelihood of creating a substantially planar final structure, it is desirable to match the depth of wide trench 3 to the thickness of CVD oxide 16.

Next, according to the preferred practice of the present invention, a photoresist is deposited and photolithographically processed to retain selected mask segments such as 22 over CVD oxide 16 in the central region of wide trench 3. Note the absence of resist over the active regions 8, 9 and 11, narrow trench region 2, and the perimeter regions of wide trench 3.

Substrate 1 is then subjected to an anisotropic oxide etch 23 in the presence of photoresist mask 22 to remove substantially all unmasked CVD oxide 16. Preferably this is performed with a plasma of $CHF_3$ and $O_2$, at a pressure of approximately 0.03 Torr, a temperature of approximately 30° C., using approximately 1000 watts of power, and is continued for a period of approximately 50 minutes. Note that silicon layer 14, whether it is comprised of intrinsic poly, doped poly or amorphous silicon, serves as an effective oxide etchant stop.

Following the etch of CVD oxide 16 with plasma 23 as described with reference to FIG. 1, and a conventional solvent strip of photoresist mask 22, one is left with the structure depicted in FIG. 2 of the drawings. With reference to this cross-section, note that CVD oxide 16 formerly under photoresist 22 (FIG. 1) remains intact, while elsewhere all that remains of oxide layer 16 are the small sidewall segments at locations 24, 25, 26 and 27. The later remain by virtue of the relative thickness of oxide layer 16 (FIG. 1) in the direction of the reactive ion etching. It is particularly noteworthy that poly layer 14 serves as a highly effective oxide etch stop, and as such, returns the narrow trench 2 and the etched perimeter regions 28 and 29 of wide trench 3 to nearly their original topography.

Figure 2:
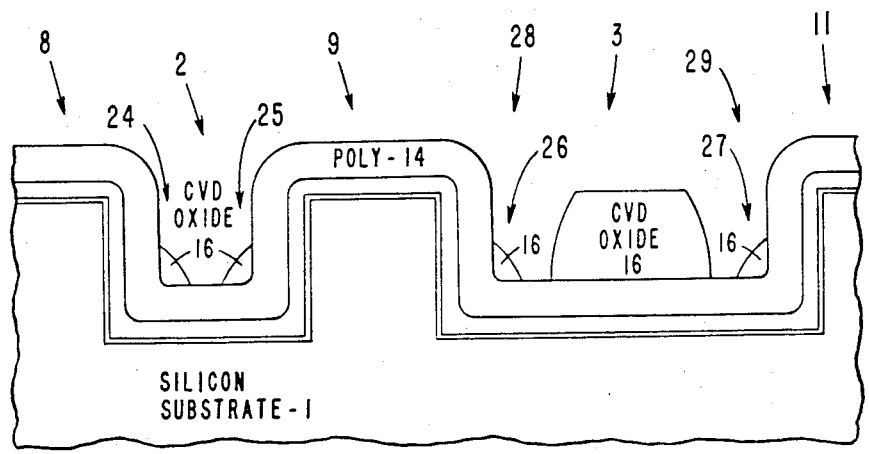
FIG. 2 is a schematic cross-section of the substrate in FIG. 1 following an anisotropic etch of the exposed oxide.
Figure 3:
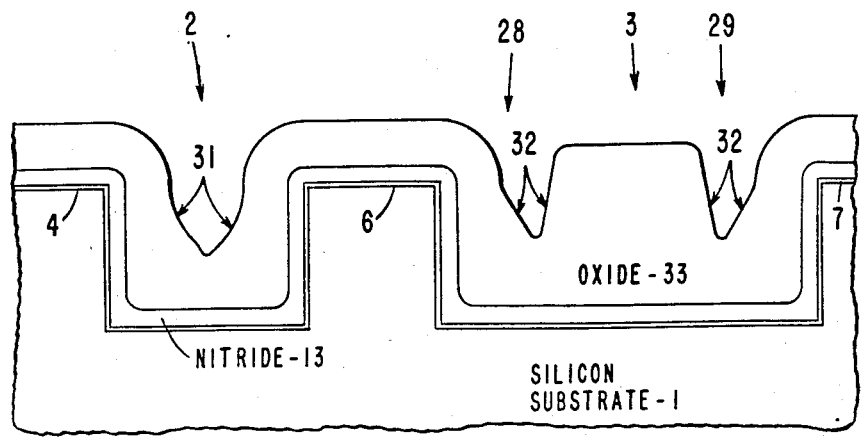
FIG. 3 is a schematic cross-section of the substrate following thermal oxidation of the polysilicon.

Following the anisotropic etch which produces the cross-section depicted in FIG. 2, the substrate is subjected to another oxidizing ambient, preferably composed of $H_2O$ and $O_2$, at an temperature of 1150° C. and a pressure of 1 atmosphere, for a period of approximately 320 minutes, to convert polysilicon layer 14 into silicon dioxide. A representative resultant structure is generally depicted in FIG. 3 of the drawings. Note that the nominal 2:1 volumetric increase during the conversion of the poly 14 (FIG. 2) to silicon dioxide produces a partial dielectric fill of the narrow trenches and perimeter regions, from the bottom and sides, to blend in with the residual CVD oxides formerly at 24, 25, 26 and 27 (FIG. 2). Undesired oxidation of silicon substrate 1 is prevented by the masking effect of nitride layer 13. Upon the conclusion of the oxidation, the cross-section as depicted in FIG. 3 shows the presence of a trench oxide 33 rising to a level above the plane of active region surfaces 4, 6 and 7, and various moderately tapered recesses 31 and 32. Recesses 31 correspond to narrow trench regions 2, while recesses 32 are related to the perimeters of the wide trenches. Given the constrained shapes and relatively shallow depths of such recesses 31 and 32, it is now possible to fill all trench regions with oxide to a level suitable for planarization.

To complete the oxide filling and planarization, the structure in FIG. 3 is preferably next subjected to a second CVD polysilicon conformal deposition, which deposition is to provide a polysilicon layer having nominal depth of approximately 250 nanometers following the formerly described technique. The deposition can be implemented by any one of various other conventionally utilized techniques, and can, as suggested earlier, encompass the use of lightly doped poly or amorphous silicon. Thereafter, the silicon is converted to a silicon dioxide dielectric by thermal oxidation in progressing to the structure depicted in FIG. 4. Though it is also possible to fill recesses 31 and 32 directly with a CVD oxide, or any other readily planarizable dielectric, the dielectric properties of thermal oxide are commonly preferred. Note again that nitride layer 13 provides the oxidation barrier by which undesired conversion of silicon substrate 1 is inhibited.

Figure 4:
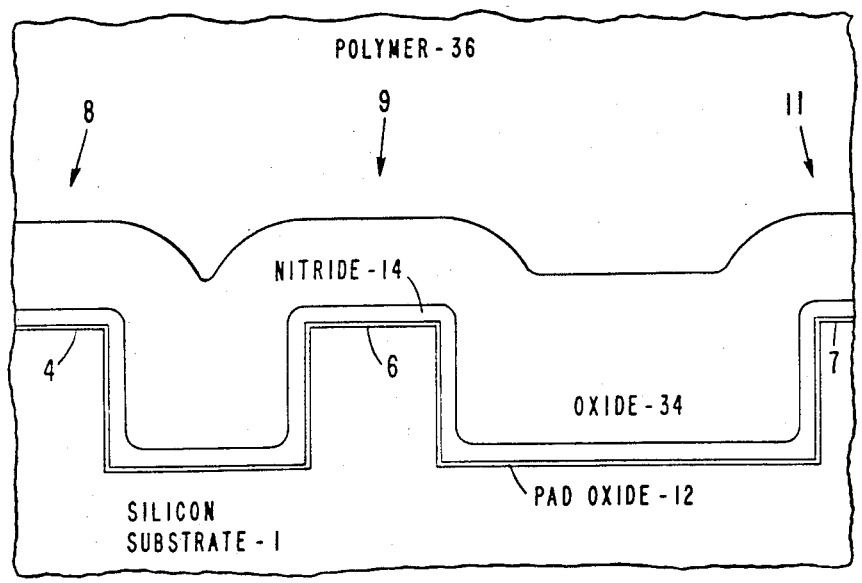
FIG. 4 is a schematic cross-section of the substrate following further oxide formation.
Figure 5:
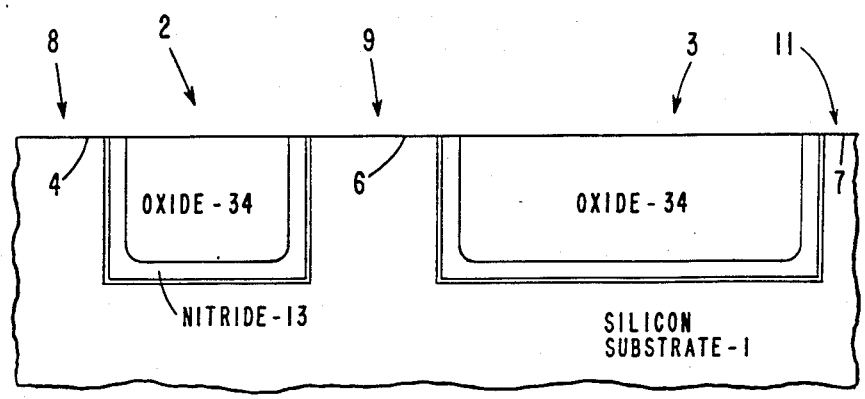
FIG. 5 is a schematic cross-section of the substrate following planarization.

FIG. 4 shows the cross-section following the void free filling of all trenches and recesses to form a silicon dioxide 34 having a level materially above the plane of active region surfaces 4, 6 and 7. The structure depicted in FIG. 4 is then planarized following any one of various known techniques. Preferably, such final stages of planarization involves the use of a spin-on planarizing polymer 36 and an etch back using a plasma which etches polymer 36 and any exposed oxide 34 at substantially equal rates. The etch is continued until nitride layer 14 overlying active region surfaces 4, 6 and 7 is exposed. Thereafter, a 1:1 silicon nitride-to-silicon dioxide etch is used to remove the silicon nitride cap over surfaces 4, 6 and 7, later being further modified to remove PAD oxide 12 and oxide 34 at equal rates. The concluding structure is illustrated in FIG. 5. Note that the completed structure in FIG. 5 includes both narrow 2 and wide 3 dielectric filled trenches separating active regions 8, 9 and 11, in which the trench and active region surfaces are substantially coplanar. Thereafter, active devices may be formed by utilizing any one of numerous commonly practiced techniques.

The etch back from the structure in FIG. 4 is preferably performed using a planarizing polymer and an etching plasma composed of $CHF_3$ and $O_2$, at a temperature of approximately 50° C., a pressure of approximately 0.04 Torr, and using approximately 1000 watts of power. To ensure a 1:1 etch ratio in progressing through the various layers the gas composition is optimally varied by change the $O_2$ flow rate in four increments from 40 sccm to 5 sccm while maintaining the $CHF_3$ flow rate at approximately 75 sccm.

It will no doubt now be appreciated that the present invention provides a trench oxide isolation fabrication process by which trenches of diverse widths can be readily filled and planarized using thermal oxide while substantially avoiding the inclusion of cavities in the narrow trenches. It should also be understood that the present process avoids critical fabrication operations and multiple masks, with the intent of improving manufacturing yield and reducing costs. In particular note the dual role of poly layer 14, first as an etch stop during the patterned removal of CVD oxide 16 and later as a source of silicon for the partial filling of the narrow trenches and wide trench perimeters. The use of the poly as an etch stop also eliminates the need for elaborate end point detection during the oxide etch operation. In still another respect, note that the alignment of photoresist 22 is not critical, in that misalignments merely vary the widths of regions 28 and 29, which regions continue to exhibit the characteristics of a narrow trench and as such are subsequently filled by the conversion of polysilicon layer 14 and further oxide formation steps.

In addition to the above benefits, it should be understood and appreciated that the dimensions of poly layer 14 and oxide layer 16 can be adjusted for the alignment tolerances associated with the formation of photoresist 22. The ability to refine such variables provides the user of the present invention with a significant degree of latitude in particularizing the features to the intended application.

We claim:

1. A process for creating dielectric material filled trenches of diverse widths between active regions of a semiconductor substrate, comprising the steps of:
    forming trenches in the substrate;
    forming a first conformal layer comprised of an oxidation barrier material over the trenches and active regions;
    forming a second conformal layer over the oxidation barrier material, the second conformal layer being comprised of a material which is characterized first by its ability to withstand etchants of a dielectric material and secondly by its convertability to a dielectric upon conditioning;
    depositing a third, substantially conformal, layer comprising of a dielectric material;
    selectively removing dielectric material from the active regions, the narrow width trenches, and the perimeter regions of the wide width trenches;
    converting the material of the second conformal layer to a dielectric;

filling the regions of selectively removed dielectric material with a further dielectric material to a level above the planar of the active regions; and planarizing the substrate to the level of the active regions.

2. The process recited in claim 1, wherein the step of selectively removing dielectric material is comprised of:

the forming of mask over the central regions of the wide width trenches; and anisotropically etching the dielectric material in the presence of the mask.

3. The process recited in claim 2, wherein the material of the second conformal layer volumetrically expands upon conversion to a dielectric material and in so doing partially fills the narrow width trenches and perimeter regions of the wide width trenches with dielectric.

4. The process recited in claim 3, wherein the step of converting the material of the second conformal layer to a dielectric is comprised of thermal oxidation.

5. The process recited in claim 4, wherein the step of filling the regions of selectively removed dielectric material with further dielectric material is comprised of:

forming a silicon layer; and thermally oxidizing the silicon layer.

6. The process recited in claim 4, wherein the step of filling the regions of selectively removed dielectric material with further dielectric material is comprised of depositing a layer of CVD silicon dioxide.

7. The process recited in claim 5, wherein the oxidation barrier material is comprised of silicon nitride, the second conformal layer is comprised of polycrystalline or amorphous silicon, and the third, substantially conformal, layer is comprised of CVD silicon dioxide.

8. The process recited in claim 7, wherein the step of planarizing the substrate to a level of the active regions is comprised of:

forming a planarizing polymer layer over the thermally oxidized silicon layer;

etching the polymer and thermally oxidized silicon at corresponding rates to the plane of the active regions; and removing the silicon nitride layer from over the active regions.

9. A process for creating oxide filled trenches of diverse widths between active regions of a silicon substrate, comprising the steps of:

etching vertically oriented trenches in the substrate;

thermally oxidizing the substrate to form a PAD silicon dioxide layer;

depositing a relatively thin conformal silicon nitride layer;

depositing a conformal silicon layer;

depositing a relatively thick, substantially conformal, silicon dioxide layer;

etching the deposited silicon dioxide layer from over the active regions, the narrow width trenches, and the perimeter regions of the wide width trenches;

thermally oxidizing the conformal silicon layer to partially fill the narrow width trenches and the perimeter regions of the wide width trenches with silicon dioxide;

forming a layer of silicon dioxide over the substrate; and planarizing the substrate to the level of the active regions.

10. The process recited in claim 9, wherein the step of etching the deposited silicon dioxide is comprised of:

photolithographically forming a masking layer of photoresist over the central regions of the wide width trenches; and anisotropically etching the silicon dioxide in the presence of the mask with a silicon dioxide etchant ineffective against silicon.

11. The process recited in claim 10, wherein the anisotropic etch of the silicon dioxide is terminated following the removal of all vertically exposed silicon dioxide except nominal residuals situated within the inside corners of the narrow width trenches and the perimeter regions of the wide width trenches.

* * * * *